(12) United States Patent
Hyakutake et al.

(10) Patent No.: US 10,928,732 B2
(45) Date of Patent: Feb. 23, 2021

(54) SUBSTRATE LIQUID PROCESSING APPARATUS, SUBSTRATE LIQUID PROCESSING METHOD, AND STORAGE MEDIUM

(71) Applicant: Tokyo Electron Limited, Tokyo (JP)

(72) Inventors: Hironobu Hyakutake, Kumamoto (JP); Takafumi Tsuchiya, Kumamoto (JP); Koichiro Kanzaki, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 148 days.

(21) Appl. No.: 15/209,136

(22) Filed: Jul. 13, 2016

(65) Prior Publication Data

US 2017/0025268 A1    Jan. 26, 2017

(30) Foreign Application Priority Data

Jul. 22, 2015  (JP) .............................. JP2015-145185

(51) Int. Cl.
*G03F 7/42* (2006.01)
*H01L 21/67* (2006.01)

(52) U.S. Cl.
CPC ........ *G03F 7/423* (2013.01); *H01L 21/67028* (2013.01); *H01L 21/67086* (2013.01); *H01L 21/67253* (2013.01)

(58) Field of Classification Search
None
See application file for complete search history.

(56) References Cited

U.S. PATENT DOCUMENTS 5,730,162 A * 3/1998 Shindo ............. H01L 21/02052
134/66
6,158,447 A * 12/2000 Kamikawa ............... B08B 3/08
134/100.1

(Continued)

FOREIGN PATENT DOCUMENTS

JP    2000-164550 A    6/2000
JP    2001-077118 A    3/2001

(Continued)

*Primary Examiner* — Mikhail Kornakov
*Assistant Examiner* — Pradhuman Parihar
(74) *Attorney, Agent, or Firm* — Abelman, Frayne & Schwab

(57) ABSTRACT

Disclosed is a substrate liquid processing apparatus including: a processing bath in which a processing liquid is stored; a chemical liquid component supply unit that supplies chemical liquid components; a concentration detecting unit that detects a concentration of the chemical liquid components; and a controller configured to perform a first control as a feedback control that replenishes the processing liquid with the chemical liquid components such that the concentration of the chemical liquid components contained in the processing liquid within the processing bath does not become less than a predetermined allowable lower limit, based on the concentration of the chemical liquid components detected by the concentration detecting unit. In addition, the controller performs a second control that replenishes the processing liquid with the chemical liquid components in a predetermined amount required to offset a reduction in concentration of the chemical liquid components caused by the introduction of the substrate.

13 Claims, 3 Drawing Sheets

(56) References Cited

U.S. PATENT DOCUMENTS

| | | | |
|---|---|---|---|
| 6,241,827 B1* | 6/2001 | Tanaka | B08B 3/102 |
| | | | 134/10 |
| 6,492,271 B1* | 12/2002 | Uozumi | H01L 21/32134 |
| | | | 257/E21.309 |
| 2005/0008532 A1* | 1/2005 | Jenkins | C23F 11/149 |
| | | | 422/14 |
| 2011/0126860 A1* | 6/2011 | Hyakutake | H01L 21/67057 |
| | | | 134/19 |
| 2011/0132465 A1* | 6/2011 | Eshima | H01L 21/67051 |
| | | | 137/2 |

FOREIGN PATENT DOCUMENTS

| | | |
|---|---|---|
| JP | 2002-282755 A | 10/2002 |
| JP | 2007-042912 A | 2/2007 |
| JP | 2009-170692 A | 7/2009 |
| JP | 2010-283297 A | 12/2010 |

\* cited by examiner

SUBSTRATE LIQUID PROCESSING APPARATUS, SUBSTRATE LIQUID PROCESSING METHOD, AND STORAGE MEDIUM

CROSS-REFERENCE TO RELATED APPLICATIONS

This application is based on and claims priority from Japanese Patent Application No. 2015-145185 filed on Jul. 22, 2015 with the Japan Patent Office, the disclosure of which is incorporated herein in its entirety by reference.

TECHNICAL FIELD

The present disclosure relates to a technique for suppressing reduction in concentration of chemical liquid components in a processing liquid stored in a processing bath when performing a processing by immersing a substrate in the processing liquid.

BACKGROUND

A photolithography technique is used for forming a circuit pattern on a substrate such as, for example, a semiconductor wafer. After a desired circuit pattern is formed, a resist film is removed from the substrate by using a sulfuric acid hydrogen peroxide mixture (SPM) liquid. The resist removal processing is performed, for example, by immersing a plurality of (e.g., fifty (50)) substrates in the SPM liquid stored in a processing bath while the substrates are held by a substrate holder called a wafer boat (see, e.g., Japanese Patent Laid-Open Publication No. 2000-164550).

When performing a batch processing that collects a plurality of substrates to process the substrates at a time, the concentration of chemical liquid components in the processing liquid falls below an allowable lower limit as a reaction proceeds at once after the substrates are introduced. When a period in which the concentration of the chemical liquid components in the processing bath is below the allowable lower limit is long, a time required for the resist removal processing becomes longer.

SUMMARY

According to an exemplary embodiment, the present disclosure provides a substrate liquid processing apparatus including: a processing bath in which a processing liquid is stored, and a substrate is immersed in the stored processing liquid, thereby performing a processing of the substrate; a chemical liquid component supply unit configured to supply chemical liquid components for producing the processing liquid, to the processing liquid; a concentration detecting unit configured to detect a concentration of the chemical liquid components contained in the processing liquid; and a controller configured to perform a first control as a feedback control that causes the chemical liquid component supply unit to replenish the processing liquid with the chemical liquid components such that the concentration of the chemical liquid components contained in the processing liquid within the processing bath does not become less than a predetermined allowable lower limit, based on the concentration of the chemical liquid components detected by the concentration detecting unit. Before or immediately after the substrate is introduced into the processing liquid within the processing bath, or over a period before and after the substrate is introduced, the controller performs, in addition to the first control, a second control that causes the chemical liquid component supply unit to replenish the processing liquid with the chemical liquid components in a predetermined amount required to offset a reduction in concentration of the chemical liquid components caused by the introduction of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
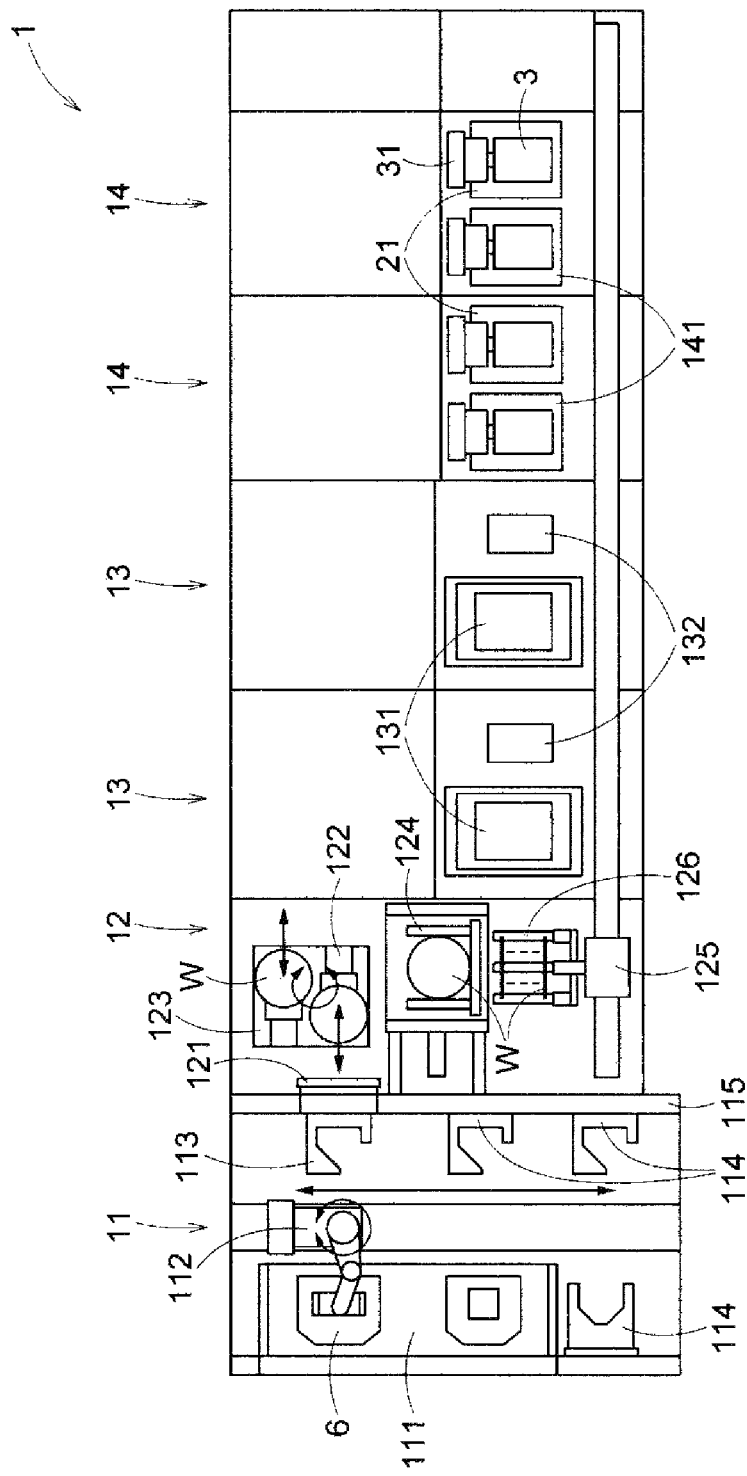
FIG. 1 is a plan view illustrating the whole configuration of a substrate processing system provided with an SPM processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technique capable of suppressing a period of reduction in concentration of the chemical liquid components in the processing bath immediately after the substrate is introduced.

According to an exemplary embodiment, the present disclosure provides a substrate liquid processing apparatus including: a processing bath in which a processing liquid is stored, and a substrate is immersed in the stored processing liquid, thereby performing a processing of the substrate; a chemical liquid component supply unit configured to supply chemical liquid components for producing the processing liquid, to the processing liquid; a concentration detecting unit configured to detect a concentration of the chemical liquid components contained in the processing liquid; and a controller configured to perform a first control as a feedback control that causes the chemical liquid component supply unit to replenish the processing liquid with the chemical liquid components such that the concentration of the chemical liquid components contained in the processing liquid within the processing bath does not become less than a predetermined allowable lower limit, based on the concentration of the chemical liquid components detected by the concentration detecting unit. Before or immediately after the substrate is introduced into the processing liquid within the processing bath, or over a period before and after the substrate is introduced, the controller performs, in addition to the first control, a second control that causes the chemical liquid component supply unit to replenish the processing liquid with the chemical liquid components in a predetermined amount required to offset a reduction in concentration of the chemical liquid components caused by the introduction of the substrate.

In the above-described substrate liquid processing apparatus, the controller changes a replenishment amount of the processing liquid in the second control depending on the number of the introduced substrates.

In the above-described substrate liquid processing apparatus, a resist film is formed on a surface of the substrate, the processing liquid is an SPM liquid, the chemical liquid components are sulfuric acid and hydrogen peroxide, and the controller changes the replenishment amount of the processing liquid in the second control in accordance with at least one of the following conditions: the number of the substrates to be introduced into the processing bath; a parameter indicating an amount of the resist film present on the surface of the substrate; the kind of the resist film; and presence or absence, or a degree of a processing on the resist film that affects a reactivity of the SPM liquid to the resist film.

The above-described substrate liquid processing apparatus further includes: an outer bath configured to receive the processing liquid overflowing from the processing bath; a circulation line connecting the outer bath and the processing bath; and a pump configured to form a flow of the processing liquid from the outer bath toward the processing bath, in the circulation line. The chemical liquid component supply unit is provided to supply the processing liquid to the outer bath or the circulation line. The processing liquid within the processing bath is replenished with the chemical liquid components by supplying the processing liquid to the outer bath or the circulation line.

According to another exemplary embodiment, the present disclosure provides a substrate liquid processing method including: immersing a substrate in a processing liquid stored in a processing bath; performing a first control as a feedback control that detects a concentration of chemical liquid components contained in the processing liquid, and replenishes the processing liquid with the chemical liquid components such that the concentration of the chemical liquid components contained in the processing liquid within the processing bath does not become less than a predetermined allowable lower limit, based on the concentration of the chemical liquid components; and before or immediately after the substrate is introduced into the processing liquid within the processing bath, or over a period before and after the substrate is introduced, performing, in addition to the first control, a second control that replenishes the processing liquid with the chemical liquid components in a predetermined amount required to offset a reduction in concentration of the chemical liquid components caused by the introduction of the substrate.

In the above-described substrate liquid processing method, a replenishment amount of the processing liquid in the second control is changed depending on the number of the introduced substrates.

In the above-described substrate liquid processing method, a resist film is formed on a surface of the substrate, the processing liquid is an SPM liquid, the chemical liquid components are sulfuric acid and hydrogen peroxide, and the controller changes the replenishment amount of the processing liquid in the second control in accordance with at least one of the following conditions: the number of the substrates to be introduced into the processing bath; a parameter indicating an amount of the resist film present on the surface of the substrate; the kind of the resist film; and presence or absence, or a degree of a processing on the resist film that affects a reactivity of the SPM liquid to the resist film.

According to still another exemplary embodiment, the present disclosure provides a storage medium that stores a program for controlling a substrate processing apparatus in which, when executed, cause a computer to control the substrate liquid processing apparatus and execute the substrate liquid processing method as described above.

According to the exemplary embodiments of the present disclosure, the period where the concentration of the chemical liquid components after the introduction of the substrate is reduced may be suppressed to the minimum.

Figure 2:
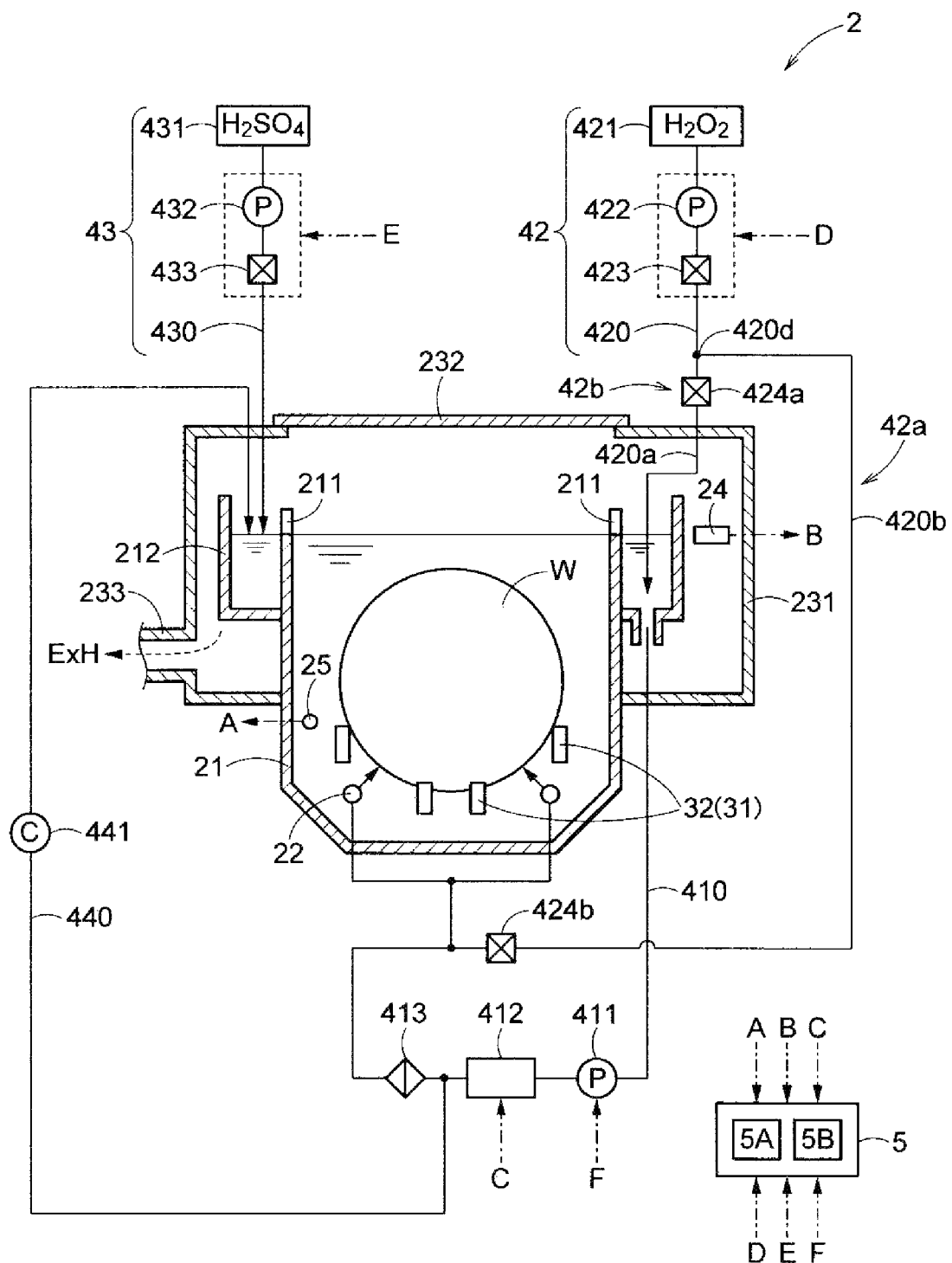
FIG. 2 is a piping diagram including a vertical-sectional view of a processing bath for explaining the configuration of the SPM processing apparatus.

First, descriptions will be briefly made on a wafer processing system 1 provided with an SPM processing apparatus 2, which is an exemplary embodiment of the substrate liquid processing apparatus, with reference to FIGS. 1 and 2. The wafer processing system 1 includes a carry-in/out section 11 configured to perform a carry-in/out of a FOUP 6, an interface section 12 configured to perform an arrangement and a posture change of wafers W, two (2) drying processing sections 13 each configured to dry the wafers W, and two (2) SPM processing sections 14 each configured to perform an SPM processing.

The carry-in/out section 11 is provided with a placing table 111 configured to receive or deliver the FOUP 6 from or to an external conveyance device, a first conveyance arm 112 configured to convey the FOUP 6 in the carry-in/out section 11, a delivery table 113 configured to place the FOUP 6 thereon for the carry-in/out of the wafers W to/from the FOUP 6, and storage shelves 114 configured to temporarily store the FOUP 6 after taking out the wafers W.

The first conveyance arm 112 may convey the FOUP 6 among the placing table 111, the delivery table 113, and each storage shelf 114. The delivery table 113 is fixed to a partition wall 115 that separates the carry-in/out section 11 and the interface section 12. The partition wall 115 is provided with a door 121 that has a function to attach and detach a cover provided on the front surface of the FOUP 6.

The interface section 12 is provided with two (2) delivery arms 122 configured to perform a take-out or storage of the wafers W with respect to the FOUP 6 placed on the delivery table 113, a posture changing device 124 configured to perform a posture change of the wafers W, and a second conveyance arm 125 configured to convey the wafer W among the interface section 12, each drying processing section 13, and each SPM processing section 14.

The delivery arms 122 are provided on a rotatable arm table 123. Each delivery arm 122 is capable of holding a plurality of wafers W with a horizontal posture side by side in the vertical direction. The posture changing device 124 may rotate the plurality of wafers W held together to switch between a state where the wafers W line up with a horizontal posture in the vertical direction and a state where the wafers W line up with a vertical posture in the horizontal direction. The second conveyance arm 125 may move fifty (50) wafers W that line up with a vertical posture in the horizontal direction, in a state of being held by a wafer support 126, horizontally between the interface section 12, each drying processing section 13, and each SPM processing section 14.

Each drying processing section 13 is provided with an arm cleaning unit 132 configured to clean the wafer support 126 of the second conveyance arm 125, and a wafer drying unit 131 configured to perform a drying processing on the wafers W and the wafer support 126 after cleaning.

Each SPM processing section 14 is provided with an SPM processing bath 21 configured to store an SPM liquid, and a rinse bath 141 configured to store a rinse liquid (e.g., pure water) for a rinse processing of the wafer W after an SPM processing. A wafer boat 3 and an elevating mechanism 31 thereof are provided in the SPM bath 21 and the rinse bath 141. The wafer boat 3 is capable of holding a plurality of wafers W in the same posture and arrangement as those taken when the second conveyance arm 125 holds the wafers W. The elevating mechanism 31 moves up and down the wafer boat 3 between a delivery position where the delivery of the wafers W is performed between the wafer boat 3 and the second conveyance arm 125, and a processing position where the wafers W held by the wafer boat 3 is immersed in the SPM liquid within the SPM processing bath 21.

As illustrated in FIG. 2, the wafer boat 3 includes four rod-shaped wafer supports 32 extending in a direction perpendicular to the paper surface. Each wafer support 32 includes a plurality of (fifty (50) to fifty two (52)) wafer holding grooves (not illustrated) formed at intervals along the longitudinal direction. The wafer support 32 is fixed to a base (not illustrated) which is moved up and down by the elevating mechanism 31.

The SPM processing bath 21 is made of quartz or polypropylene. An outer bath 212 surrounds the whole circumference of the upper end portion of the SPM processing bath 21, and receives an SPM liquid overflowing from the SPM processing bath 21. A plurality of V-shaped notches 211 are formed in the upper peripheral portion of the SPM processing bath 21. By forming the notches 211, the SPM liquid flows out smoothly from the upper end of the SPM processing bath 21.

Two rod-shaped SPM supply nozzles 22 are provided in the bottom portion within the SPM processing bath 21 to supply the SPM liquid into the SPM processing bath 21. Each SPM supply nozzle 22 includes a number of injection holes 221 formed at an interval in the longitudinal direction. The SPM supply nozzles 22 inject the SPM liquid obliquely upwardly toward the wafers W immersed in the SPM liquid within the SPM processing bath 21 in a state where the wafers W are held at an interval in the horizontal direction (the direction perpendicular to the paper surface of FIG. 2) with a posture perpendicular to the wafer boat 3.

One end of a circulation line 410 is connected to the bottom wall of the outer bath 212. The other end of the circulation line 410 is connected to the SPM supply nozzles 22. In the circulation line 410, a pump 411 configured to form a flow of the SPM liquid from the outer bath 212 toward the SPM processing bath 21 (the SPM supply nozzles 22 in the SPM processing bath 21), a heater 412 configured to heat the SPM liquid, and a filter 413 configured to remove solid impurities in the SPM liquid are interposed in this order. During the normal operation of the SPM processing apparatus 2, the pump 411 is always operated, and the SPM liquid overflowing from the SPM processing bath 21 to the outer bath 212 returns to the SPM processing bath 21 through the circulation line 410 and the SPM supply nozzles 22.

Based on the temperature of the SPM liquid detected by a temperature sensor 25 provided in the SPM processing bath 21, a power to be supplied to the heater 412 is controlled such that the temperature of the SPM liquid within the SPM processing bath 21 is to be a predetermined temperature, for example, a temperature in a range of 100° C. to 130° C.

At a downstream side of the pump 411, a sampling line 440 for monitoring a chemical liquid component concentration is branched from the circulation line 410. The sampling line 440 is interposed with a concentration detecting unit 441 configured to monitor the concentration of the chemical liquid components contained in the SPM liquid (i.e., hydrogen peroxide concentration and sulfuric acid concentration). The downstream end of the sampling line 440 is connected to the outer bath 212, and the SPM liquid flowing from the circulation line 410 to the sampling line 440 returns to the outer bath 212.

The outer bath 212 is connected with a hydrogen peroxide bath 421 through a hydrogen peroxide supply line 420. In the hydrogen peroxide supply line 420a, hydrogen peroxide supply pump 422 and an opening/closing valve 423 are interposed in sequence. The hydrogen peroxide bath 421, the hydrogen peroxide supply line 420, and the hydrogen peroxide supply pump 422 constitute a hydrogen peroxide supply unit 42, that is, a first chemical liquid component supply unit.

The outer bath 212 is also connected with a sulfuric acid bath 431 through a sulfuric acid supply line 430. In the sulfuric acid supply line 430, a sulfuric acid supply pump 432 and an opening/closing valve 433 are interposed in sequence. The sulfuric acid bath 431, the sulfuric acid supply pump 432, and the sulfuric acid supply valve 433 constitute a sulfuric acid supply unit 43, that is, a second chemical liquid component supply unit.

The pipe constituting the hydrogen peroxide supply line 420 is opened at a height position adjacent to the bottom wall of the outer bath 212. The pipe constituting the sulfuric acid supply line 430 is opened at a relatively high height position in the outer bath 212. By doing this, the hydrogen peroxide having a low specific gravity is mixed well in the SPM liquid. Meanwhile, the pipe constituting the hydrogen peroxide supply line 420 may be inserted into the inside of the discharge port formed in the bottom wall of the outer bath 212 (the discharge port is connected with the circulation line 410) such that the tip end (opening end) of the pipe is positioned, for example, about 1 cm downward from the inlet of the discharge port.

Similarly to the SPM processing bath 21, the outer bath 212 is made of a transparent member such as, for example, quartz or polypropylene. For example, an optical liquid level sensor 24 is provided to detect whether the liquid level in the outer bath 212 is higher than a predetermined height in advance. When the liquid level is low, the chemical liquid components are replenished in a determined ratio by the hydrogen peroxide supply unit 42 and the sulfuric acid supply unit 43 regardless of a feedback control of the chemical liquid concentration (to be described later).

A hood 231 covers the SPM processing bath 21 and the outer bath 212. The hood 231 suppresses the inside of the wafer processing system 1 from being contaminated due to the diffusion of SPM vapors evaporated from the SPM processing bath 21 and the outer bath 212. The atmosphere within the hood 231 is discharged to a factory exhaust system through an exhaust path 233 connected to a lower sidewall of the hood 231. A cover 232 is provided on the top surface of the hood 231. During the carry-in/out of the wafers W, the cover 232 is opened, so that the wafer boat 3 holding the wafers W can be moved up and down.

Further, the wafer processing system 1 includes a control device 5. The control device 5 is, for example, a computer, and includes a controller 5A and a storage unit 5B. The storage unit 5B stores a program that controls various processings performed in the wafer processing system 1. The controller 5A controls the operations of the wafer processing system 1 including the SPM processing apparatus 2 by reading and executing the program stored in the storage unit 5B.

Meanwhile, the program may be recorded in a computer-readable storage medium, and installed from the storage medium to the storage unit 5B of the control device 5. The computer-readable recording medium may be, for example, a hard disc (HD), a flexible disc (FD), a compact disc (CD), a magnet optical disc (MO), or a memory card.

Hereinafter, the operations of the wafer processing system 1 will be described. A FOUP 6 which accommodates twenty five (25) wafers W is carried to the placing table 111 by an external conveyance robot. The FOUP 6 is moved to the delivery table 113 by the first conveyance arm 112.

The door 121 having a cover detachable function removes the cover of the FOUP 6. Any one of the two delivery arms 122 enters into the FOUP 6 and takes out the wafers W. The cover is attached to the empty FOUP 6, and then, the first conveyance arm 112 moves the delivery table 6 to the storage shelf 114.

The arm table 123 is rotated such that the delivery arm 122 faces the posture changing device 124. The wafers W are delivered from the delivery arm 122 to the posture changing device 124.

The posture changing device 124 performs an interval adjustment and a posture change of the wafers W, and then, delivers the wafers W to the second conveyance arm 125 positioned in the interface section 12. The same operation is performed on twenty five (25) wafers W taken out from another FOUP 6, and thus, the second conveyance arm 125 holds fifty (50) wafers W. Then, the second conveyance arm 125 carries the wafers W into one of the two SPM processing sections 14. That is, the wafers W are delivered from the second conveyance arm 125 to the wafer boat 3 at a move-up position.

Subsequently, the wafer boat 3 is moved down so that the wafers W are immersed in the SPM liquid within the SPM processing bath 21, and the cover 232 of the hood 231 is closed. When the wafers W are immersed in the SPM liquid for a predetermined period of time (e.g., 10 minutes to 15 minutes), the resist film present on the surface of the wafers W is removed. The resist film removal processing (SPM processing) and SPM liquid concentration management will be described later.

Subsequently, the cover 232 is opened, so that the wafer boat 3 is moved up, and the second conveyance arm 125 receives the SPM-processed wafers W from the wafer boat 3. Then, the cover 232 is closed. The second conveyance arm 125 carries the wafers W into the rinse bath 141, and a pure water rinse of the wafers W is performed therein. Subsequently, the wafers W are conveyed to the drying processing section 13, and a drying processing of the wafers W with IPA vapor is performed therein. The wafers W are conveyed to the interface section 12 by the second conveyance arm 125.

Thereafter, the fifty (50) wafers W are changed in posture by the posture changing device 124 in reverse order to the order as described above, and then, returned to the original FOUPs 6 by twenty five (25) sheets by the delivery arm 122. The FOUPs 6 that accommodate the processed wafers W are moved onto the placing table 111 by the first conveyance arm 112.

Hereinafter, descriptions will be made on the SPM processing and the SPM concentration management performed in the SPM processing bath 21 in detail.

Main chemical reactions related to the SPM liquid are as follows.

$H_2O_2 \rightarrow H_2O + \frac{1}{2}O_2$   $H_2O_2$ self-decomposition reaction:

$H_2SO_4 + H_2O_2 \rightarrow H_2SO_5 + H_2O \rightarrow H_2SO_4 + H_2O + \frac{1}{2}O_2$   Redox reaction:

$H_2SO_5 + C$ (resist) $\rightarrow H_2SO_4 + CO_2$   Resist oxidation reaction:

Accordingly, variation in $H_2O_2$ (hydrogen peroxide) and $H_2SO_4$ (sulfuric acid) in the SPM liquid is as follows.

$H_2O_2$ (hydrogen peroxide) is changed to water by a reaction producing Caro's acid ($H_2SO_5$) which contributes to the resist oxidation reaction, as well as by the self-decomposition reaction. Accordingly, the total amount and concentration of hydrogen peroxide contained in the SPM liquid decrease with the lapse of time.

The total amount of sulfuric acid in the SPM liquid does not decrease with the lapse of time by the chemical reactions as described above. However, since water derived from the hydrogen peroxide by the chemical reactions as described above is produced in a large amount, the concentration of sulfuric acid contained in the SPM liquid decreases with the lapse of time.

Further, in addition to the above, when the wafers W with resist attached thereto are immersed in the SPM liquid, the resist oxidation reaction occurs, and thus, the redox reaction is facilitated. Therefore, the hydrogen peroxide concentration in the SPM liquid rapidly decreases. In addition, since the hydrogen peroxide-derived water increases, the sulfuric acid concentration also decreases.

Other factors influencing the change in concentrations of hydrogen peroxide and sulfuric acid are that water contained in the SPM liquid heated at a relatively high temperature (e.g., 100° C. to 130° C.) is evaporated, and that, when the processed wafers W are conveyed from the SPM processing bath 21 to the rinse bath 141, the SPM liquid is carried out from the SPM processing bath 21 along with the wafers W. However, the influence of these factors is less significant as compared with the above chemical reactions.

In order to appropriately process the wafers W with the resist attached thereto, the Caro's acid concentration in the SPM liquid needs to be maintained in a proper range. To this end, the hydrogen peroxide concentration and the sulfuric acid concentration need to be maintained in a proper range.

Thus, the hydrogen peroxide concentration and the sulfuric acid concentration in the SPM liquid are constantly monitored by the concentration detecting unit 441 provided in the sampling line 440. When the hydrogen peroxide concentration detected by the concentration detecting unit 441 falls below a predetermined allowable lower limit (management value), hydrogen peroxide is supplied to the SPM liquid by the hydrogen peroxide supply unit 42 in accordance with the feedback control. The supply of hydrogen peroxide may be performed by opening the opening/closing valve 423, and driving the hydrogen peroxide supply pump 422. Similarly, when the sulfuric acid concentration detected by the concentration detecting unit 441 falls below a predetermined allowable lower limit (management value), sulfuric acid is supplied to the SPM liquid by the sulfuric acid supply unit 43 in accordance with the feedback control. The supply of sulfuric acid may be performed by opening the opening/closing valve 433, and driving the hydrogen peroxide supply pump 432.

The above-described feedback control of the hydrogen peroxide concentration may be performed as follows. That is, when it is detected that the hydrogen peroxide concentration falls below the predetermined lower limit, a predetermined certain amount of hydrogen peroxide is supplied from the hydrogen peroxide supply unit 42 to the SPM liquid. For the supply, a metering pump (e.g., a diaphragm pump) may be used as the hydrogen peroxide supply pump 422. When the hydrogen peroxide concentration is still below the lower limit even after a predetermined time elapses from the supply of a certain amount of hydrogen peroxide, the above-described certain amount of hydrogen peroxide are further supplied to the SPM liquid. The feedback control of the sulfuric acid may be performed in the same manner Meanwhile, this feedback control will be referred to as "feedback control 1."

Meanwhile, in a batch processing apparatus, a number of wafers (about fifty (50) wafers in a recent general batch processing apparatus) are simultaneously processed at a time. Thus, when a number of wafers W are introduced into the SPM processing bath 21, the chemical liquid components in the SPM liquid are rapidly consumed, so that the chemical liquid component concentration is rapidly reduced. At this time, since it is difficult to increase a response speed of the feedback control, it takes some time until the chemical liquid component concentration rapidly reduced immediately after the introduction of the wafers W is restored. Until the chemical liquid concentration is restored, the wafers W are processed with an SPM liquid having a low Caro's acid concentration, resulting in a longer time required to completely peel the resist.

In order to address the problem, the present exemplary embodiment estimates the reduction of the chemical liquid component concentration in the SPM liquid occurring due to the reaction between the introduced wafers W and the SPM liquid after the introduction of the wafers W. Then, the chemical liquid components are supplied from the hydrogen peroxide supply unit 42 and the sulfuric acid supply unit 43 to the SPM liquid in an amount required to offset the estimated reduction of the chemical liquid concentration (or substantially the same amount as the required amount) before (preferably, immediately before) the introduction (immersion) of the wafers W into the SPM liquid (pre-replenishment). During the pre-replenishment of the chemical liquid components at the time of the introduction of the wafers W, the above-described feedback control is invalidated, and after the pre-replenishment of the chemical liquid components is completed, the above-described feedback control is validated again.

The amount required to offset the reduction of the chemical liquid concentration may be determined by calculation (simulation), by experiment, or in combination of experiment and calculation. When determined by experiment, for example, in a case where a normal feedback is performed only, the amount of hydrogen peroxide (or sulfuric acid) supplied from the hydrogen peroxide supply unit 42 (or the sulfuric acid supply unit 43) for a period until the wafers W are taken out after the introduction to the SPM processing bath 21, is measured, and the amount may be considered as an amount required to offset the reduction of the chemical liquid component concentration.

The reduction of the chemical liquid component concentration in the SPM liquid due to the processing of the wafers W is influenced by various conditions (hereinafter, referred to as "workpiece parameters") such as, for example, the number of wafers W to be processed at once (batch size), parameters indicating the amount of the resist film present on the wafer surface (e.g., thickness, total area, or total volume), the kind of the resist film, presence or absence of an additional processing (e.g., ion implantation or ashing) influencing the reactivity of the SPM liquid with the resist film, or a magnitude thereof (e.g., an ion implantation amount in the ion implantation). Therefore, the supply amount of the chemical liquid components required to offset the reduction of the chemical liquid component concentration (hereinafter, referred to as a "required replenishment amount") may be determined in consideration of the workpiece parameters. The required replenishment amount corresponding to a combination of various workpiece parameters may be stored in the storage unit 5B of the control device 5. In this case, the control device 5 grasps a workpiece parameter related to the wafers to be processed by the SPM processing apparatus 2 from now on, and draws a required replenishment amount corresponding to the grasped workpiece parameter, from the storage unit 5B. The parameter related to the wafers W to be processed from now on may be grasped, for example, by referring to a process recipe stored in the storage unit 5B, or receiving information from a host computer that manages operations of various processing systems provided in a semiconductor manufacturing factory.

Without using the control procedure as described above, the pre-replenishment may be defined in advance by a process recipe. That is, for example, before performing the operation of "the wafer boat 3 is moved down to the processing position to immerse unprocessed wafers W into the SPM liquid within the SPM processing bath 21," commend values corresponding to the operation of "hydrogen peroxide is supplied from the hydrogen peroxide supply unit 42 at a flow rate of X1 liters per second for Y1 seconds" and the operation of "sulfuric acid is supplied from the sulfuric acid supply unit 43 at a flow rate of X2 liters per second for Y2 seconds" may be incorporated into the process recipe.

In general, in the wafer processing system 1, an operation called a mapping that confirms the accommodation state of the wafers W in the FOUP 6 is performed after the FOUP 6 is placed on the delivery table 113 and the cover of the FOUP 6 is removed, and before the delivery arm 122 takes out the wafers W from the FOUP 6. For the mapping operation, an optical mapping sensor (not illustrated) is provided in the interface section 12. Data about the number of the wafers W accommodated in the FOUP 6 detected during the mapping may be used as one of the workpiece parameters. As described above, in the case where the chemical liquid replenishment before the introduction of the wafers W is defined by a process recipe, the supply time of the chemical liquid components defined by the process recipe may be changed according to the data of the wafers detected during the mapping. That is, in a case where fifty (50) wafers W are processed at a time (i.e., the batch size is 50), when the batch size of the wafers W to be processed at the end of a single processing lot is 30, the replenishment amount of the chemical liquid components before the introduction of the wafers W may be corrected to, for example, ⅗ of the amount defined by the process recipe. Instead of using the data of the wafer mapping as described above, a wafer counter (not illustrated) may be provided in the conveyance path of the wafers W from the FOUP 6 to the SPM processing bath 21 to grasp the number of wafers W to be processed at once in the processing bath 21, based on the number of the wafers W measured by the wafer counter.

According to the exemplary embodiment, it is possible to grasp the workpiece parameters related to the wafers to be processed from now on, and supply (replenish) the chemical liquid components (sulfuric acid and hydrogen peroxide) in a required replenishment amount corresponding to the grasp workpiece parameters before the introduction of the wafers W to the SPM liquid. Therefore, even though the chemical liquid components are rapidly reduced after the introduction of the wafers W, the chemical liquid component concentration does not fall below the allowable lower limit, or the period when the chemical liquid component concentration falls below the allowable lower limit may be suppressed to the minimum. Therefore, a desired processing result (peeling the resist on the wafers W) can be securely obtained within a scheduled processing time. That is, it is possible to suppress reduction in throughput of the SPM processing apparatus 2, furthermore, the wafer processing system 1. In addition, it is possible to suppress resist peeling failure.

Further, since sulfuric acid and hydrogen peroxide are replenished before, especially, immediately before the introduction of the wafers W, Caro's acid, which is produced by the reaction between sulfuric acid and hydrogen peroxide, reacts with the resist before it is decomposed. Thus, the resist removal processing may be efficiently performed.

As described above, when the replenishment is performed with a relatively large amount of the chemical liquid components before the introduction of the wafers W, the chemical liquid component concentration in the SPM liquid temporarily becomes relatively high. However, in the SPM processing, even though the chemical liquid component concentration is slightly increased, portions of the wafers W other than resist will not be damaged.

In the above exemplary embodiment, the pre-replenishment of the chemical liquid components was performed before (preferably, immediately before) the introduction of the wafers W into the SPM liquid, but not limited thereto. The pre-replenishment may be performed at the same time as the introduction of the wafers W, or immediately after the introduction of the wafers W. In this case, substantially the same effect as in the above exemplary embodiment may be obtained. Meanwhile, the pre-replenishment of the chemical liquid components may be performed over a period before and after the introduction of the wafers W. In this case, the pre-replenishment of the chemical liquid components may be performed within a period from a time point of about $1/10$ of the SPM processing time before the introduction time point of the wafers W to a time point of about $1/10$ of the SPM processing time after the introduction time point of the wafers W. That is, when the SPM processing time is 10 minutes, the period is a period from 1 minute before the introduction of the wafers W to 1 minute after the introduction of the wafers W.

In the above exemplary embodiment, the replenishment of the SPM liquid with the chemical liquid components was performed by supplying the chemical liquid components to the outer bath 212, but not limited thereto. The chemical liquid components may be supplied to an arbitrary position in the circulation system including the SPM processing bath 21, the outer bath 212, and the circulation line 410. For example, the chemical liquid components may be supplied to the SPM liquid flowing in the circulation line 410. Further, for example, when the wafers W are not in the SMP processing bath 21, the chemical liquid components may be supplied directly into the SPM processing bath 21. That is, each of the hydrogen peroxide supply unit 42 and the sulfuric acid supply unit 43 may be connected to one or more sites in the circulation system.

Even in a case where the processing liquid is any other than the SPM liquid, the replenishment of the chemical liquid components before (or immediately after) the introduction of the wafers W is useful. For example, the processing liquid may be a mixture of ammonia and hydrogen peroxide, a mixture of phosphoric acid and hydrogen peroxide, or a mixture of hydrochloric acid and hydrogen peroxide, which is used for a cleaning processing in manufacturing a semiconductor device. However, in a case where a non-negligible damage might occur in a film on the wafer W other than a removal target when the chemical liquid component concentration is set too high, the replenishment amount of the chemical liquid components may be reduced to the extent that any damage does not causes a problem.

Further, the mixture is not limited to a mixture of two kinds of chemical liquids, but may be a mixture of three or more kinds of chemical liquids.

The substrate that is a processing target is not limited to the semiconductor wafer W, but may be another kind of substrate such as, for example, a glass substrate or a ceramic substrate.

Example

A test was performed to confirm an effect of a case where hydrogen peroxide and sulfuric acid were replenished immediately before introducing wafers. The test was performed using an SPM processing apparatus having the configuration illustrated in FIG. 2. In Comparative Example, concentration management of chemical liquid components in an SPM liquid was always performed by feedback control 1 as described above. In Example, in addition to feedback 1 as described above, replenishment of chemical liquid components was performed before the introduction of wafers W according to the exemplary embodiment as described above. However, while performing the replenishment of the chemical liquid components immediately before the introduction of the wafers W, feedback control 1 was invalidated.

Figure 3:
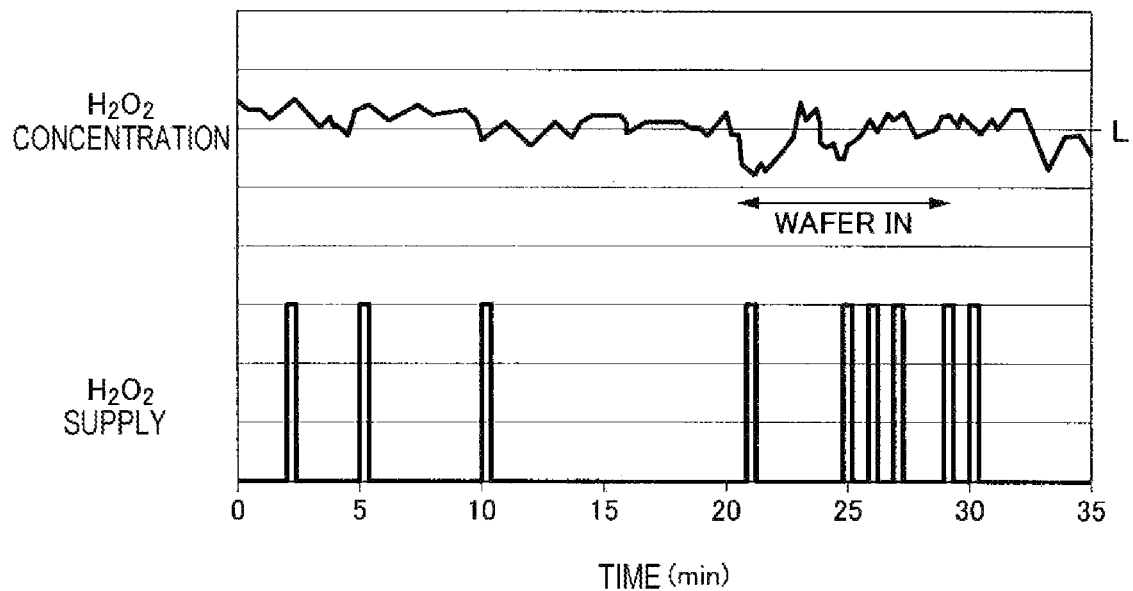
FIG. 3 is a time chart for explaining a change in concentration of a chemical liquid component and a chemical liquid replenishment operation (Comparative Example).
Figure 4:
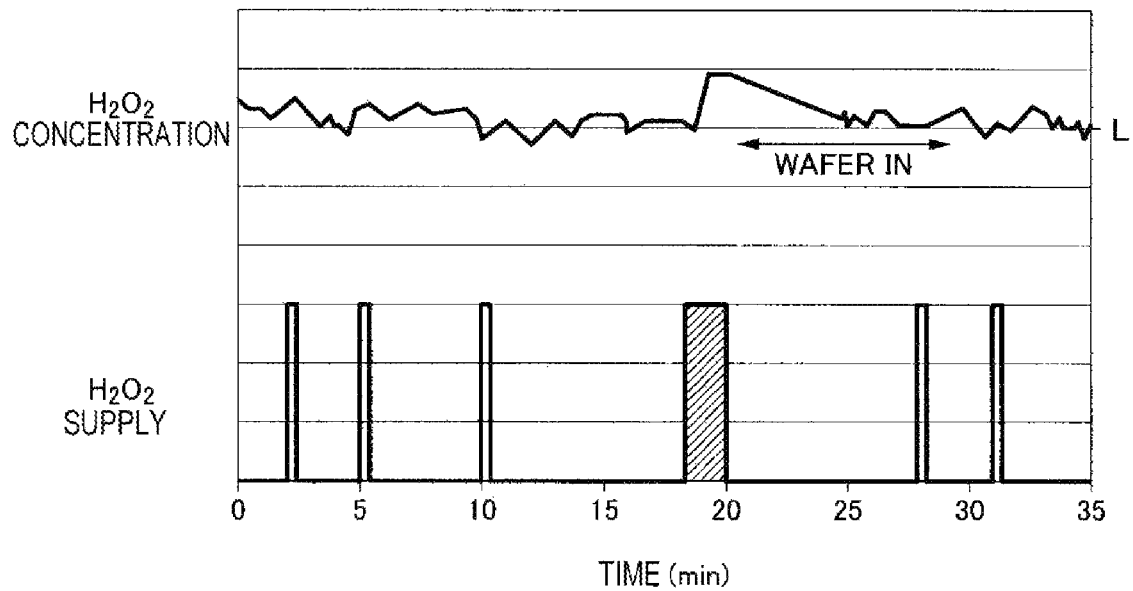
FIG. 4 is a time chart for explaining a change in concentration of a chemical liquid component and a chemical liquid replenishment operation (Example).

The test result of Comparative Example is illustrated in the graph of FIG. 3, and the test result of Example is illustrated in the graph of FIG. 4. The upper end in each graph indicates a temporal change of the hydrogen peroxide concentration in the SPM liquid. L denotes an allowable lower limit of the hydrogen peroxide concentration. The arrow marked as "WAFER IN" represents a period when the wafers are immersed in the SPM liquid stored in the SPM processing bath. The lower end in each graph indicates a supply timing of hydrogen peroxide into the SPM liquid. The rise of the pulse forms indicates the supply of hydrogen peroxide. The supply flow rate of hydrogen peroxide into the SPM liquid is always constant, and the total supply amount of hydrogen peroxide is adjusted by changing the supply time. The rise of the pulse form with hatching indicates the supply of hydrogen peroxide immediately before the introduction of wafers.

As illustrated in FIG. 3, in Comparative Example, significant reduction in hydrogen peroxide concentration occurred immediately after the introduction of wafers. Further, first of all, a relatively long time was required until the hydrogen peroxide concentration, which was reduced to be less than the allowable lower limit L, reached the allowable lower limit L or higher to become stable. In contrast, as illustrated in FIG. 4, in Example, the hydrogen peroxide concentration in the SPM liquid was substantially maintained at the allowable lower limit L or higher, even after the introduction of wafers. Description of results for sulfuric acid was omitted, but results of substantially the same trend were obtained.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
a processing bath in which a processing liquid is stored, and a substrate is immersed in the stored processing liquid such that a processing is performed on the substrate;
a first chemical liquid component supply including a first pipe and configured to supply a first chemical liquid component for producing the processing liquid to the processing liquid;
a second chemical liquid component supply including a second pipe and configured to supply a second chemical liquid component for producing the processing liquid to the processing liquid;
an outer bath configured to receive the processing liquid overflowing from the processing bath and directly receive both the first pipe to receive the first chemical liquid component and the second pipe to receive the second chemical liquid component;
a circulation line configured to connect the outer bath to the processing bath and directly receive the second chemical liquid component;
a sampling line branched from the circulation line to be connected to the outer bath and including a concentration detector configured to monitor concentrations of each of the first and second chemical liquid components contained in the processing liquid such that the concentration of each of the first and second chemical liquid components is maintained in a predetermined range, the sampling line being configured to return a portion of the processing liquid flowing therein from the circulation line to the outer bath; and
a controller configured to perform a first control as a feedback control that causes the first and second chemical liquid component supply units to replenish the processing liquid with the first and second chemical liquid components when the concentrations of the first and second chemical liquid components contained in the processing liquid within the processing bath fall below a predetermined allowable lower limit of the predetermined range, based on the concentrations of the first and second chemical liquid components monitored by the concentration detector,
wherein, before or immediately after the substrate is introduced into the processing liquid within the processing bath, or over a predetermined period before and after the substrate is introduced, the controller is configured to perform, in addition to the first control, a second control that causes the first chemical liquid component supply and the second chemical liquid component supply to replenish the processing liquid with the first and second chemical liquid components in a predetermined amount required to offset a reduction in concentrations of the first and second chemical liquid components caused by the introduction of the substrate.

2. The substrate liquid processing apparatus of claim 1, wherein the controller is further configured to change a replenishment amount of the processing liquid in the second control depending on a number of the introduced substrates.

3. The substrate liquid processing apparatus of claim 1, wherein a resist film is formed on a surface of the substrate, the processing liquid is a sulfuric acid hydrogen peroxide mixture (SPM) liquid,
the chemical liquid components are sulfuric acid and hydrogen peroxide, and
the controller is further configured to change the replenishment amount of the processing liquid in the second control in accordance with at least one of the following conditions:
a number of the substrates to be introduced into the processing bath;
a parameter indicating an amount of the resist film present on the surface of the substrate;
a kind of the resist film; and
presence or absence, or a degree of a processing on the resist film that affects a reactivity of the SPM liquid to the resist film.

4. The substrate liquid processing apparatus of claim 1, further comprising:
a pump configured to form a flow of the processing liquid from the outer bath toward the processing bath, in the circulation line; and
wherein the processing liquid within the processing bath is replenished with the first and second chemical liquid components by supplying the processing liquid to the outer bath and the circulation line respectively.

5. The substrate liquid processing apparatus of claim 1, further comprising:
a hood configured to cover the processing bath and the outer bath; and
a cover provided on a top surface of the hood.

6. The substrate liquid processing apparatus of claim 1, the controller is further configured to perform the second control within the predetermined period from a time point before $\frac{1}{10}$ of an immersing time during which the substrate is immersed in the stored processing liquid to a time point after $\frac{1}{10}$ of the immersing time.

7. The substrate liquid processing apparatus of claim 1, the controller is further configured to:
perform the second control while the first control is being invalidated; and
after the second control is completed, cause the first control to be validated again.

8. The substrate liquid processing apparatus of claim 1, wherein the second pipe for supplying the second chemical liquid component to the outer bath is inserted into a discharge port of the outer bath, the discharge port being directly connected to the circulation line.

9. A substrate liquid processing method comprising:
providing a substrate liquid processing apparatus including:
a processing bath in which a processing liquid is stored, and a substrate is immersed in the stored processing liquid such that a processing is performed on the substrate;
a first chemical liquid component supply including a first pipe and configured to supply a first chemical liquid component for producing the processing liquid to the processing liquid;
a second chemical liquid component supply including a second pipe and configured to supply a second chemical liquid component for producing the processing liquid to the processing liquid;
an outer bath configured to receive the processing liquid overflowing from the processing bath and directly receive both the first pipe to receive the first chemical liquid component and the second pipe to receive the second chemical liquid component;
a circulation line configured to connect the outer bath to the processing bath and directly receive the second chemical liquid component; and a sampling line branched from the circulation line to be connected to the outer bath and including a concentration detector configured to monitor a concentration of the chemical liquid components contained in the processing liquid such that the concentration of the chemical liquid components is maintained in a predetermined range, the sampling line being configured to return a portion of the processing liquid flowing therein from the circulation line to the outer bath;

immersing the substrate in the processing liquid stored in the processing bath;

monitoring, by the concentration detector, the concentration of the chemical liquid components contained in the processing liquid such that the concentration of the chemical liquid components is maintained in the predetermined range;

performing a first control as a feedback control such that the processing liquid is replenished with the chemical liquid components when the concentration of the chemical liquid components contained in the processing liquid within the processing bath falls below a predetermined allowable lower limit of the predetermined range, based on the concentration of the chemical liquid components monitored by the concentration detector in the monitoring;

before or immediately after the substrate is introduced into the processing liquid within the processing bath, or over a predetermined period before and after the substrate is introduced, performing, in addition to the first control, a second control such that the processing liquid is replenished with the chemical liquid components in a predetermined amount required to offset a reduction in concentration of the chemical liquid components caused by the introduction of the substrate;

forming a resist film is formed on a surface of the substrate, and changing the replenishment amount of the processing liquid in the second control in accordance with at least one of the following conditions:

a parameter indicating an amount of the resist film present on the surface of the substrate;

a kind of the resist film; and a presence or absence, or a degree of a processing on a resist film formed on the surface of the substrate.

10. The substrate liquid processing method of claim 9, wherein the processing liquid is a sulfuric acid hydrogen peroxide mixture (SPM) liquid and the chemical liquid components are sulfuric acid and hydrogen peroxide.

11. A non-transitory computer-readable storage medium that stores a program for controlling a substrate processing apparatus in which, when executed, cause a computer to control the substrate liquid processing apparatus and execute the substrate liquid processing method of claim 9.

12. The substrate liquid processing method of claim 9, wherein the second control is performed within the predetermined period from a time point before $\frac{1}{10}$ of an immersing time during which the substrate is immersed in the stored processing liquid to a time point after $\frac{1}{10}$ of the immersing time.

13. The substrate liquid processing method of claim 9, wherein:

the second control is performed while the first control is being invalidated, and after the second control is completed, the first control is validated again.

* * * * *